(12) United States Patent
Schertler

(10) Patent No.: US 6,416,640 B1
(45) Date of Patent: *Jul. 9, 2002

(54) SPUTTER STATION

(75) Inventor: Roman Schertler, Wolfurt (AT)

(73) Assignee: Unakis Balzers Aktiengesellschaft, Balzers (LC)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/964,962

(22) Filed: Nov. 5, 1997

(51) Int. Cl.[7] .......................... C23C 14/00; C23C 14/32
(52) U.S. Cl. ............................ 204/298.25; 204/298.26; 204/298.28; 204/298.03
(58) Field of Search .................. 204/298.25, 298.26, 204/298.08, 298.28, 192.12, 298.03

(56) References Cited

U.S. PATENT DOCUMENTS

| | | | | |
|---|---|---|---|---|
| 4,523,985 A | * | 6/1985 | Dimock | 204/298.25 |
| 4,943,363 A | * | 7/1990 | Zejda et al. | 204/298.15 |
| 5,245,736 A | * | 9/1993 | Schertler | 29/33 |
| 5,662,785 A | * | 9/1997 | Schertler | 204/298.25 |
| 5,709,785 A | * | 1/1998 | LeBlanc, III et al. | 204/298.25 |
| 5,738,767 A | * | 4/1998 | Coad et al. | 204/192.12 |
| 5,766,360 A | * | 6/1998 | Sato et al. | 118/666 |
| 5,911,861 A | * | 6/1999 | Dubs et al. | 204/298.27 |

FOREIGN PATENT DOCUMENTS

| | | | | |
|---|---|---|---|---|
| GB | 2 137 661 | * | 10/1984 | 204/298.25 |
| JP | 62-207866 | * | 9/1987 | 204/298.25 |
| JP | 5-271934 | * | 10/1993 | 204/298.25 |

* cited by examiner

*Primary Examiner*—Stephen Kalafut
*Assistant Examiner*—Julian Mercado
(74) *Attorney, Agent, or Firm*—Notaro & Michalos P.C.

(57) ABSTRACT

A sputtering station for a disk-shaped workpiece includes one loadlock chamber, one sputtering source with a sputtering surface, a transport chamber with two workpiece handling openings, one communicating with the loadlock chamber and the other with the sputtering source. A transport device in the transport chamber has two workpiece carrier arms extending radially with respect to a rotation axis of the device. Each arm can extend and retract radially and carries a workpiece holder. The two openings of the transport chamber are radially opposite each other with respect to the axis of rotation so that the workpiece holders of the two arms may be swung toward each of the openings and about an arc of 180°.

6 Claims, 4 Drawing Sheets

SPUTTER STATION

FIELD AND BACKGROUND OF THE INVENTION

The present invention relates to a sputter station for processing circular workpieces, in particular for depositing reflective coatings on optical storage media subsequently referred to as CDs. The station comprises a lock chamber, a sputtering source with an active surface, as well as a transport chamber with one connection opening respectively to the lock chamber and the sputtering source, designed for passing through or transporting a workpiece into or from a sputtering position. This station also features a transport device in the transport chamber for transporting a workpiece between said openings.

SUMMARY OF THE INVENTION

The objective of the present invention is to propose a sputter station that combines the following advantages:

Smallest possible dimensions and minimal space requirements;

Short cycle times between loading and unloading of a workpiece through the vacuum lock;

Freely selectable installation in any mounting plane, that is, sputtering from the top down, from the bottom up, or horizontally;

Modular installation in an overall sputtering system;

Simple design, robust, and

Low manufacturing and maintenance costs.

In the sputtering station of the aforementioned type these advantages are achieved by arranging the lock chamber and the active surface of the sputtering source mutually opposite across the transport chamber and along a corresponding transverse axis, where the transport device is swivel mounted around an axis of rotation in the transport chamber and is driven for swiveling, said axis being perpendicular to the transverse axis and defines a plane together with said transverse axis, the transport device comprising at least one carrier arm that is radially or parallel extendable or retractable relative to the axis of rotation, where said carrier arm features a workpiece holder at the end opposite the axis of rotation.

In the preferred embodiment said transport device has at least two such arms.

The parts of said arm that are movable relative to each other are preferably encapsulated by bellows.

The construction of the station according to the invention is especially simplified in the preferred arrangement, in that the workpiece holder constitutes the lock valve of the lock chamber on the transport chamber side and/or the sealing device between the sputtering source and the transport chamber.

The ability to choose any mounting plane is further improved in a most simple manner in that the workpiece holder features a retaining device for a workpiece, preferably a snap-in retaining device, for disc-shaped workpieces with center hole preferably a spring-loaded ball arrangement that engages in the center hole.

The advantage of the highly compact design is further improved in that the lock chamber is essentially defined by the wall thickness of the transport chamber wall surrounding one of the openings and/or by defining the sputter process chamber essentially by the wall thickness of the transport chamber wall surrounding the other of said openings.

In a preferred embodiment the lock chamber and the transport chamber and/or the process chamber of the sputtering source are each equipped with pump ports and/or vent ports.

If the inventive sputter station is built into a vacuum surface treatment system, an electronic module for controlling and monitoring especially said station is preferably provided. There is further provided an additional transport device that serves the lock chamber from the outside. This additional transport device moves preferably in a plane parallel to the plane of the opening between the transport chamber and lock chamber of the station and preferably constitutes the external lock valve of the lock chamber of the sputter station.

BRIEF DESCRIPTION OF THE DRAWINGS

The invention is subsequently exemplified in conjunction with the following drawings. They show.

DESCRIPTION OF THE PREFERRED EMBODIMENTS

Figure 1:
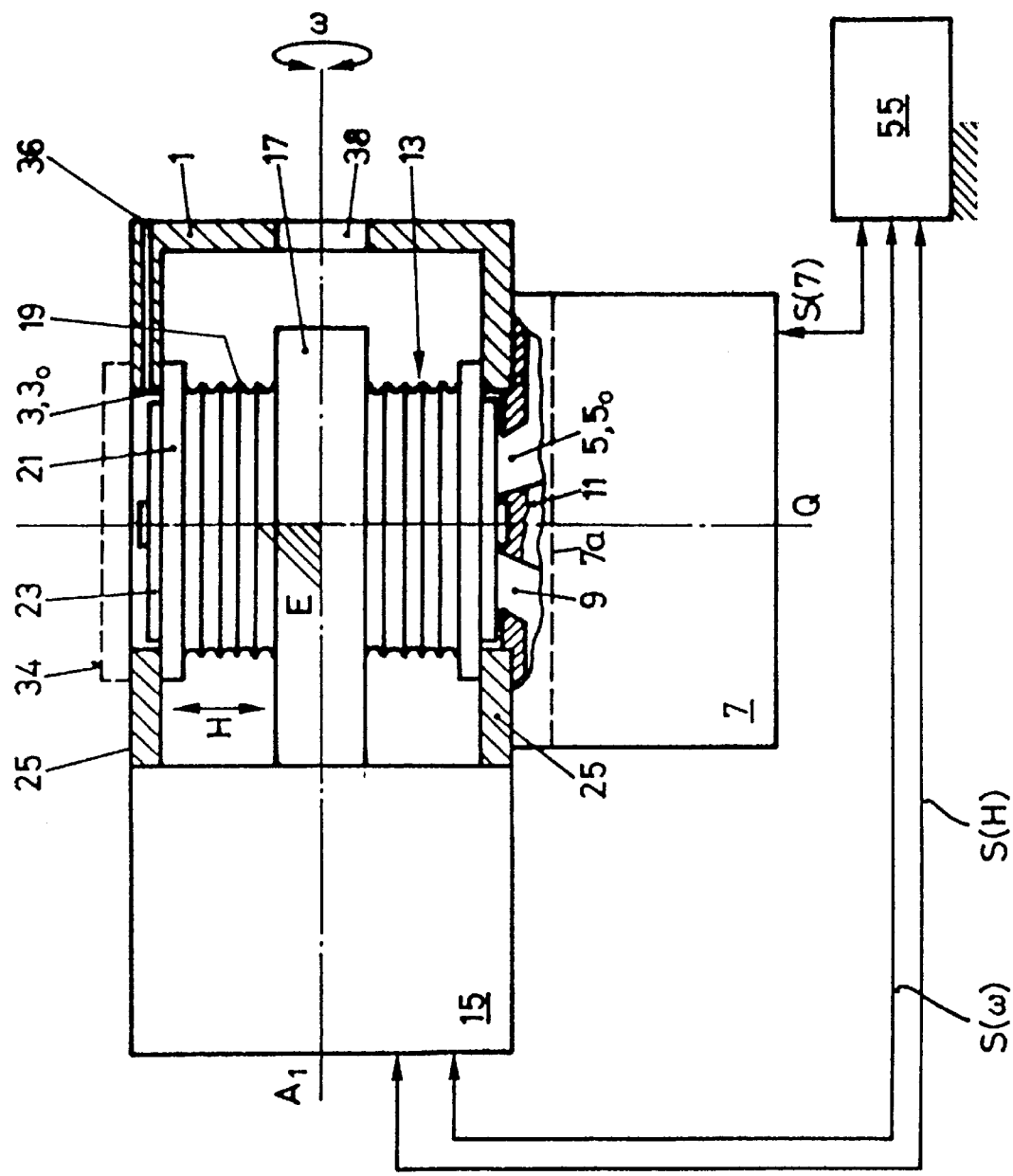
FIG. 1: A partial section through a station according to the invention, shown schematically and simplified.

According to FIG. 1 a sputter station according to the invention comprises a transport chamber 1 with two openings $3_o$ and $5_o$ located mutually opposite along a transverse axis Q through chamber 1. Flanged to opening $5_o$ is a sputtering source 7 with schematically shown peripheral mask 9 and center mask 11, as well as with the active sputtering surface 7a. Perpendicular to axis Q and located in the same plane E as the latter, the rotational axis A1 of a transport device 13 is arranged, with a drive 15 and a carrier 17. Arranged mutually opposite each other on carrier 17 are two arms 19 encapsulated by bellows and extendible toward or retractable from openings $3_o$ or $5_o$. The end of each arm 19 features a retaining plate 21 for a disc-shaped workpiece 23 with a center hole.

Wall 25 of the transport chamber 1 which surrounds opening $3_o$ with a corresponding wall thickness, defines lock chamber 3. The lock valve facing the transport chamber is formed by the appropriately positioned retaining plate 21 for a workpiece 23. If the workpiece has a center hole as shown schematically in FIG. 2, plate 21 features a centering pin 30 with radially spring-tensioned detent balls 32 which hold the mounted workpiece 23 in place. Instead of a ball detent arrangement also a suction or magnet type holder could be used.

Figure 2:
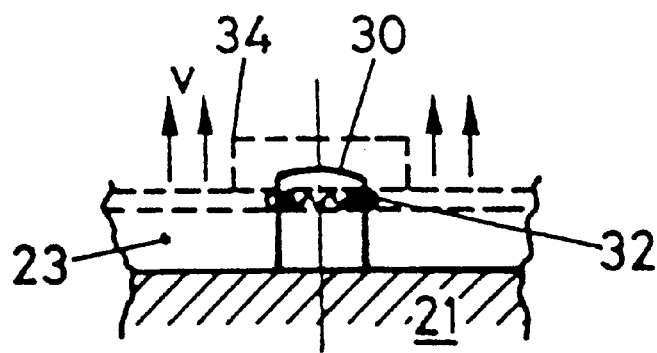
FIG. 2: A partial longitudinal section through a workpiece retaining plate at the station according to FIG. 1, with spring-loaded ball catch arrangement for a CD workpiece.

In this way it is possible to operate the station according to the invention in any spatial orientation. Shown with dashed lines is the external lock chamber cover or the external lock chamber valve 34 which is formed by an additional transport device of appropriate design that does not directly belong to the station according to the invention but which forms part of the system, or formed by a cover specifically designed therefor. As can be seen in FIG. 2 the external lock valve 34 can have a central recess into which pin 30 for picking up or returning the workpiece engages, whereby on valve 34 and as shown with arrows v, for example, a suction device pulls the workpiece toward the valve or releases it. Also in the area of opening $5_o$ to which the sputtering source 7 is flanged the sputter process chamber is formed by wall 25 of chamber 1, i.e. by its thickness.

Due to the compact design and in particular also to the small-volume load-lock chamber 3 a very short cycle time for coating a CD is achieved, for example, in the order of 3 seconds beginning with the loading of lock chamber 3 up to the discharge of the same workpiece from lock chamber 3.

At 36 a pump/vent port to the lock chamber is shown, at 38 a similar port for the transport chamber and the process chamber 5 of the sputtering station in opening $5_o$. Additionally a pump/vent port may be provided for the process chamber, if necessary.

Figure 3A:
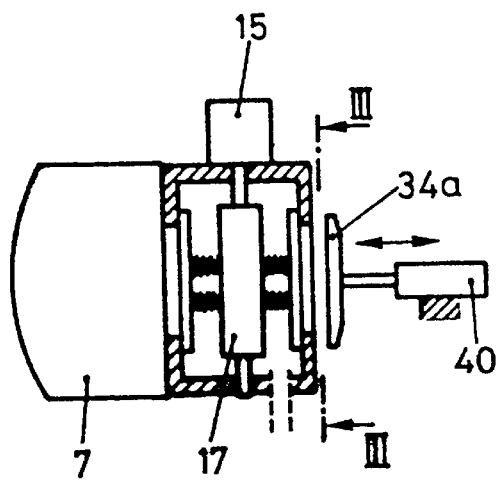
FIG. 3a: A schematic representation of a station according to the invention with a first form of realisation of an external lock chamber cover or lock chamber valve.
Figure 3B:
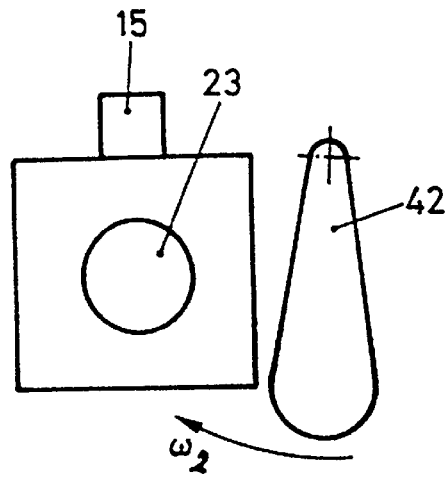
FIG. 3b: A top view on the station according to FIG. 3a with a loading arm as an external transport device.

FIG. 3a shows the station as described above where the same reference numbers as in FIG. 1 are used only for the transport device drive 15, sputtering source 7 and carrier 17. Based on the explanations to FIG. 1 the skilled artisan will readily understand the design of the station according to FIG. 3a. The external lock valve is formed by a cover 34a which, for example, is operated with a pneumatic drive 40. FIG. 3b shows the station in a section along line III—III of FIG. 3a. Also shown schematically in FIG. 3b is the loading arm 42, for example, of a press for the CD, where said arm, after completion of the pressing operation, inserts the CD as a workpiece 23 in accordance with the swivel motion $\omega_2$ between opening 3, of FIG. 1 and lock cover 34a of FIG. 3a, where it transfers the disc to the retaining plate 21, retracts, and then lock cover 34a seals the lock chamber 3.

FIGS. 4, 5, 6 and 7 which follow the same representation as FIG. 3a, illustrate stations according to the invention. The station in FIGS. 4 to 7 is always labeled with number 50.

Figure 4:
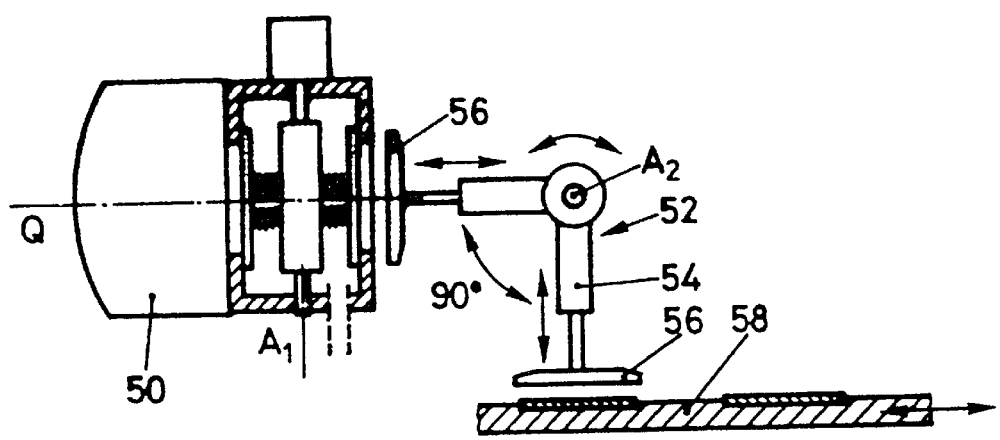
FIG. 4: An analogous diagram to FIG. 3 showing the station according to the invention with a further form of realisation of its loading/unloading mechanism.

As shown in FIG. 4 a two-arm transport device 52 features at least two transport arms 54, arranged radially relative to the axis of rotation A2 and offset by 90°, where each arm can be radially extended or retracted. Axis $A_2$ is arranged perpendicularly to plane E as shown in FIG. 1. Retaining plates 56, equipped for example with suction holders and mounted on the arms 54, allow pick up of the disc-shaped workpieces from a linear conveyor 58 and to move them to the vacuum lock loading position where transport plate 56, located opposite the lock chamber position, functions preferably as an external lock valve. In this arrangement station 50 is operated with a horizontal axis Q.

Figure 5:
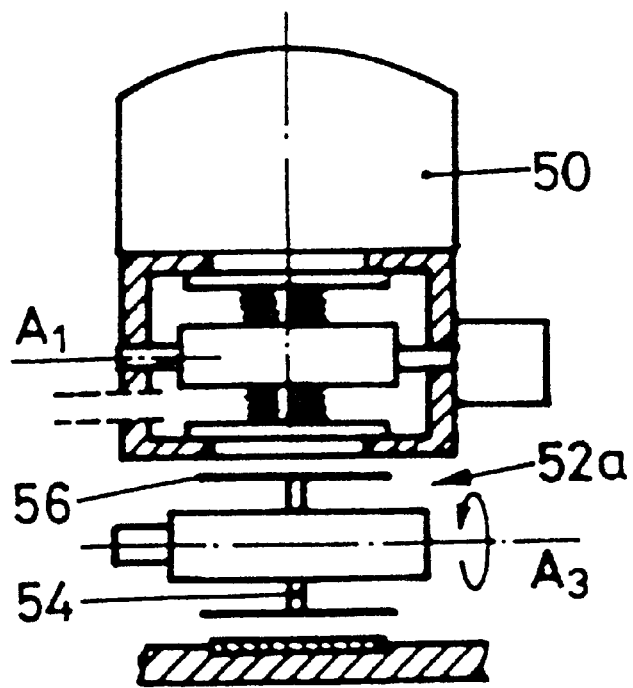
FIGS. 5 to 7: Further embodiments of the loading/unloading mechanism of a system with a station according to the invention shown analogously to FIG. 3.

As the skilled artisan will readily recognize from FIG. 5 an external or additional transport device 52a is provided which can again be swiveled with radially protruding arms 54 and retaining plates 56 around axis $A_3$ located in the plane E and parallel to axis $A_1$ of the station as shown in FIG. 1. Also in this arrangement correspondingly positioned retaining plates 56 on the additional transport device 52a form the external lock valve for station 50. In the design version according to FIG. 5 station 50 is arranged for sputtering vertically downward.

Figure 6:
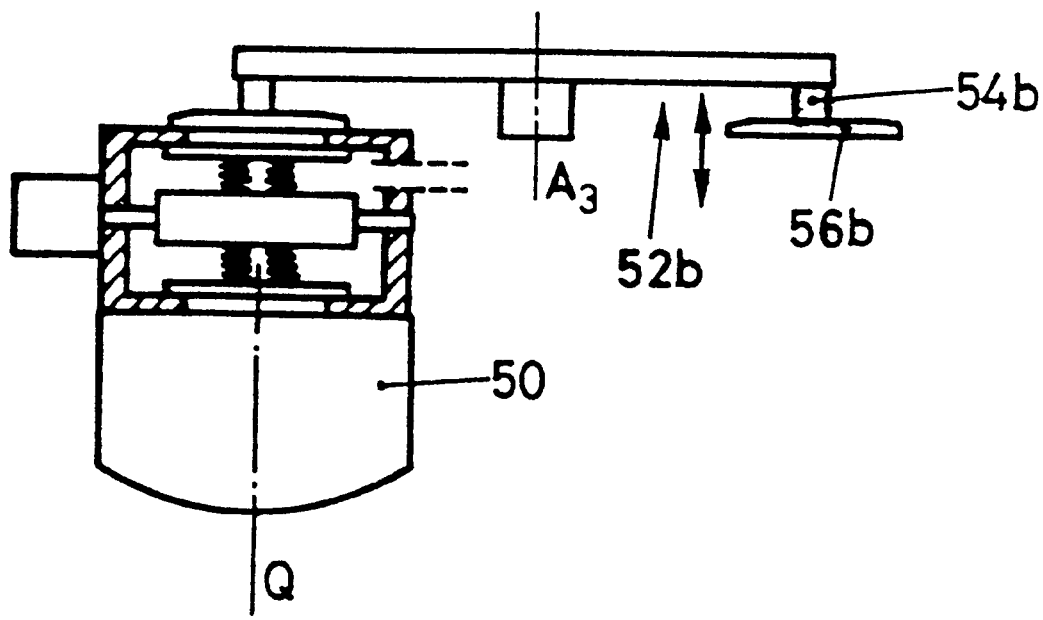

As shown in FIG. 6 the external transport device 52b features arms 54b that are extendable or retractable parallel to the axis of rotation $A_3$, where each arm is equipped with corresponding workpiece retaining plates 56b. Axis $A_3$ is parallel to axis Q of the station which in the design version according to FIG. 6 sputters vertically upward.

Also in this arrangement the workpiece retaining plates 56b function as external lock chamber valves in the corresponding position.

Figure 7:
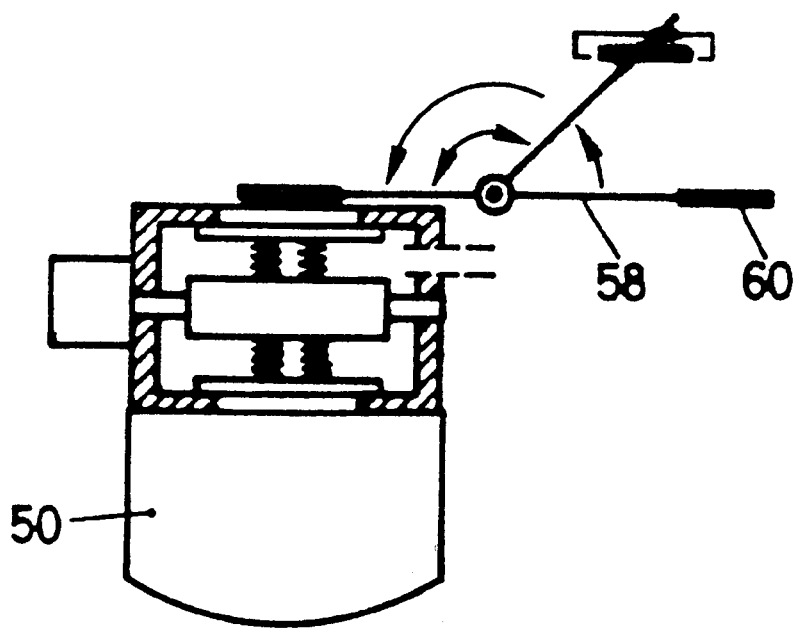

As shown schematically in FIG. 7 the external transport device features a hinged arm 58 with a swivel-mounted workpiece transport plate 60. Also in this arrangement the workpiece transport plate 60 can form the external lock valve of station 50.

As shown further in FIG. 1 at 55 a dedicated control and monitoring module is allocated to the station for a system designed according to the invention. This unit monitors and controls e.g. the rotation of the transport device around axis $A_1$, as represented by the signal $S(\omega)$, extension/retraction H of the arms, as shown by signal $S(H)$, sputter processing, as shown by $S(7)$.

What is claimed is:

1. A sputtering station for handling only two disk-shaped workpieces at a time, comprising:

a wall having a wall thickness and defining a transport chamber;

the transport chamber having a rotation axis and a transverse axis extending in the transport chamber, the rotation axis being substantially perpendicular to the transverse axis and the wall having only two, opposite workpiece handling openings consisting only of a first workpiece handling opening and a second workpiece handling opening, the transverse axis extending substantially through centers of the two workpiece handling openings and the two workpiece handling openings being defined in the wall on opposite sides of the rotation axis;

the first workpiece handling opening with the wall thickness around the first workpiece opening together defining one loadlock chamber communicating directly with an outside of the transport chamber, for receiving and for discharging one workpiece from and to the outside of the transport chamber;

a pumping port communicating with said loadlock chamber and extending in the wall thickness;

a sputtering source connected to the wall at the second workpiece handling opening, the sputtering source having a sputtering surface facing the second workpiece handling opening;

a transport device mounter for rotation around the rotation axis in said transport chamber for transporting only two workpieces between the first and second workpiece handling openings, the transport device comprising a carrier consisting of two workpiece carrier arms extending radially with respect to, and on opposite sides of the rotation axis, each carrier arm having an outer radial end with a holder for carrying one of the two workpieces, each carrier arm being radially extendable and retractable, respectively away from and toward the rotation axis, to move workpieces radially with respect to the rotation axis;

drive means connected to the transport device which are functional for only swivelling the carrier around the rotation axis by 180° while the carrier arms are retracted, to only position the workpiece carried so that one holder is at the first workpiece handling opening while the other workpiece carried is positioned so that the other holder is positioned at the second workpiece handling opening, the carrier arms then being extendable to move the workpieces into the respective workpiece handling openings;

first loadlock valve means on each of the carrier arms for sealing the loadlock chamber with respect to an interior of the transport chamber when each respective carrier arm is rotated to the first workpiece handling opening and is extended to move a workpiece into the loadlock chamber, each first loadlock valve means acting directly on the wall around the first workpiece handling opening for sealing the loadlock chamber from an interior of the transport chamber; and second loadlock valve means for sealing the loadlock chamber with respect to the outside of said chamber, the second loadlock valve means acting directly on the wall around the first workpiece handling opening for sealing the loadlock chamber from the outside of the transport chamber.

2. The station of claim 1, wherein each workpiece holder comprises a detent arrangement for engaging a center hole of a disk-shaped workpiece.

3. The station of claim 1, including a bellows encapsulating each of said arms.

4. The station of claim 1, wherein said transport chamber includes a vent port.

5. The station of claim 1, wherein said sputtering source includes a vent port.

6. The station of claim 1, including an electronics module connected to said sputtering source for at least one of controlling and monitoring operation of said sputtering source.

* * * * *

UNITED STATES PATENT AND TRADEMARK OFFICE
CERTIFICATE OF CORRECTION

PATENT NO. : 6,416,640 B1
DATED : July 9, 2002
INVENTOR(S) : Roman Schertler

It is certified that error appears in the above-identified patent and that said Letters Patent is hereby corrected as shown below:

<u>Title page,</u>
Item [73], change to read -- [73] Assignee: Unaxis Balzers Aktiengesellschaft, Balzers (LC) --

Signed and Sealed this

Fifteenth Day of October, 2002

Attest:

JAMES E. ROGAN
Attesting Officer  Director of the United States Patent and Trademark Office